United States Patent [19]

Burson et al.

[11] Patent Number: 4,554,515

[45] Date of Patent: Nov. 19, 1985

[54] CMOS OPERATIONAL AMPLIFIER

[75] Inventors: Kyle L. Burson; Scott H. Early; Apparajan Ganesan, all of Indianapolis, Ind.

[73] Assignee: AT&T Laboratories, Murray Hill, N.J.

[21] Appl. No.: 628,582

[22] Filed: Jul. 6, 1984

[51] Int. Cl.[4] .............................................. H03F 3/45
[52] U.S. Cl. .................................... 330/261; 330/253; 330/257
[58] Field of Search ............... 330/252, 253, 255, 257, 330/258, 261

[56] References Cited

U.S. PATENT DOCUMENTS 4,377,789  3/1983  Hoover ............................... 330/253

Primary Examiner—James B. Mullins
Assistant Examiner—G. Wan
Attorney, Agent, or Firm—Volker R. Ulbrich

[57] ABSTRACT

Two input stages (10,12) are interconnected so that their input common mode voltage ranges to one side of signal ground are combined to provide a common mode voltage range substantially equal to the supply voltage. One stage has N-channel differential input transistors (N1,N2), while the other stage has P-channel differential input transistors (P3,P4). The input current branches of the stages are interconnected by current mirror transistors (N6,N7) so that signal current is shared. The output (22) is taken from one branch of the N-type stage (10) and coupled to an output stage (24) with frequency compensation (C,R).

12 Claims, 4 Drawing Figures

CMOS OPERATIONAL AMPLIFIER

TECHNICAL FIELD

The invention relates generally to complementary metal-oxide-semiconductor (CMOS) device operational amplifiers and more particularly to amplifiers with an extended input common mode voltage range.

The input common-mode voltage range of an operational amplifier is the range of voltage that may be applied to both inputs without degrading its performance.

In many precision CMOS analog applications, there is a need for an operational amplifier with an input common mode voltage range which includes both power supply voltages. Some examples of such applications are antialiasing and reconstruction filters, precision voltage followers, and analog-digital buffers. Historically, depending on the CMOS process type (N-well or P-well), designers have chosen to use either strictly P-channel or N-channel operatinal amplifiers, for a variety of reasons. However, the common mode range of these topologies effectively approaches only one or the other of the supply voltages, and not both.

SUMMARY OF THE INVENTION

The novel operational amplifier in accordance with the present invention includes two differential input stages which are each designed for a maximum input common mode voltage range to only one side of signal ground. These two input stages are interconnected with two different signal current output paths which carry signal current in proportion to the polarity and magnitude of the input signal voltage. These signal output currents are combined to result in a single signal current path to an output stage. With this arrangement, the common-mode range is substantially equal to the supply voltages.

DETAILED DESCRIPTION

In the circuits described below, all the elements designated by reference symbols with an N or P prefix are MOS transistors of the enhancement mode type, with the prefix N or P indicating the conductivity type of the conduction channel of that device. All the N-channel transistors have their bulk regions connected to a negative supply voltage node, and all the P-channel transistors have their bulk regions connected to the most positive supply voltage. The connection of a transistor between points refers to the connection of its conduction path between those points. Ground potential is signal ground.

Figure 1:
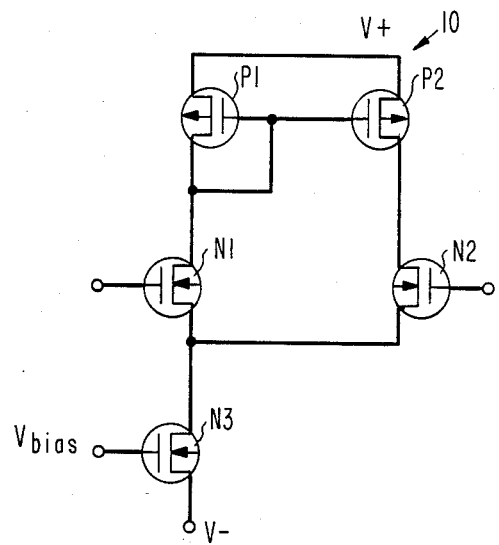
FIG. 1 is a schematic circuit diagram of the input stage of a prior art N-channel MOS device operational amplifier which is capable of having an extended positive input common mode voltage range.

FIG. 1 shows a prior art CMOS operational amplifier input stage 10 which is commonly characterized as an N-type stage due to its N-type differential input transistors N1 and N2. The devices N1 and N2 have their current supplied by a current source N3 which has its drain connected to the sources of N1 and N2 and its source connected to a negative supply voltage node V−. An active load transistor P1 is connected between the drain of N1 and a positive supply voltage node V+. An active load transistor P2 is connected between the drain of N2 and the node V+. The gates of P1 and P2 are connected together and to the drain of P1, so that P1 and P2 are in a current mirror configuration. The gate of N3 is adapted for biasing with a reference voltage Vbias. The gates of N2 and N1 provide the positive and negative amplifier input nodes. It is a characteristic of the amplifier 10 that its input common mode voltage range can be made to extend farther from signal ground toward the positive supply voltage V+ than toward the negative supply voltage V−. The typical N-channel input operational amplifier operates satisfactorily if the input common mode voltage is no lower than a Vth(of N1 and N2)+Von(of N1)+Von(of N3) above the negative supply voltage V−, where Vth is the minimum gate voltage for operation and Von is the minimum source-drain voltage required to keep the transistors in their saturated operating mode. Beyond this, the performance will degrade, due to N3 entering its linear region of operation, and will cease to operate when the devices N1 and N2 turn off. Furthermore, the current in the load devices P1 and P2 will rapidly decrease as the input common mode voltage approaches one Vth above the negative supply voltage V−. However, with properly designed input devices N1, N2 and load devices P1, P2, the N-channel input common mode voltage range can be made to include the positive supply voltage V+. To further enhance the positive common mode voltage range in a P-well technology, the substrates of the input devices N1 and N2 can be tied to the negative supply voltage V−.

Figure 2:
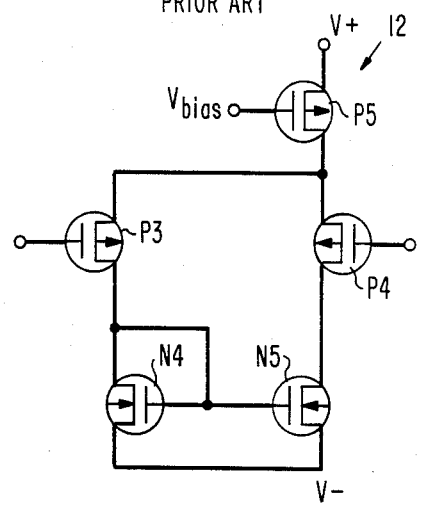
FIG. 2 is a schematic circuit diagram of the input stage of a prior art P-channel MOS device operational amplifier which is capable of having an extended negative input common mode voltage range.

FIG. 2 shows a prior art CMOS operational amplifier stage 12 which is commonly characterized as a P-type stage, due to its P-type differential input transistors P3 and P4. The devices P3 and P4 have their current supplied by a current source P5, which has its drain connected to the sources of P3 and P4 and its source connected to a positive supply voltage node V+. An active load transistor N4 is connected between the drain of P3 and the negative supply voltage node V−. An active load transistor N5 is connected between the drain of P4 and V−. The gates of N4 and N5 are connected together and to the drain of N4, so that N4 and N5 are in a current mirror configuration. The gate of P5 is adapted for biasing with a reference voltage Vbias. The gates of P3 and P4 provide input nodes. It can be seen by analogy to the operation of the N-channel stage 10 above that the P-channel stage 12 can be made to have a better common mode voltage range towards the negative supply voltage V−, but will exhibit limitations toward the positive supply voltage V+ which are similar to those exhibited by the stage 12 toward the negative supply voltage V−.

Figure 3:
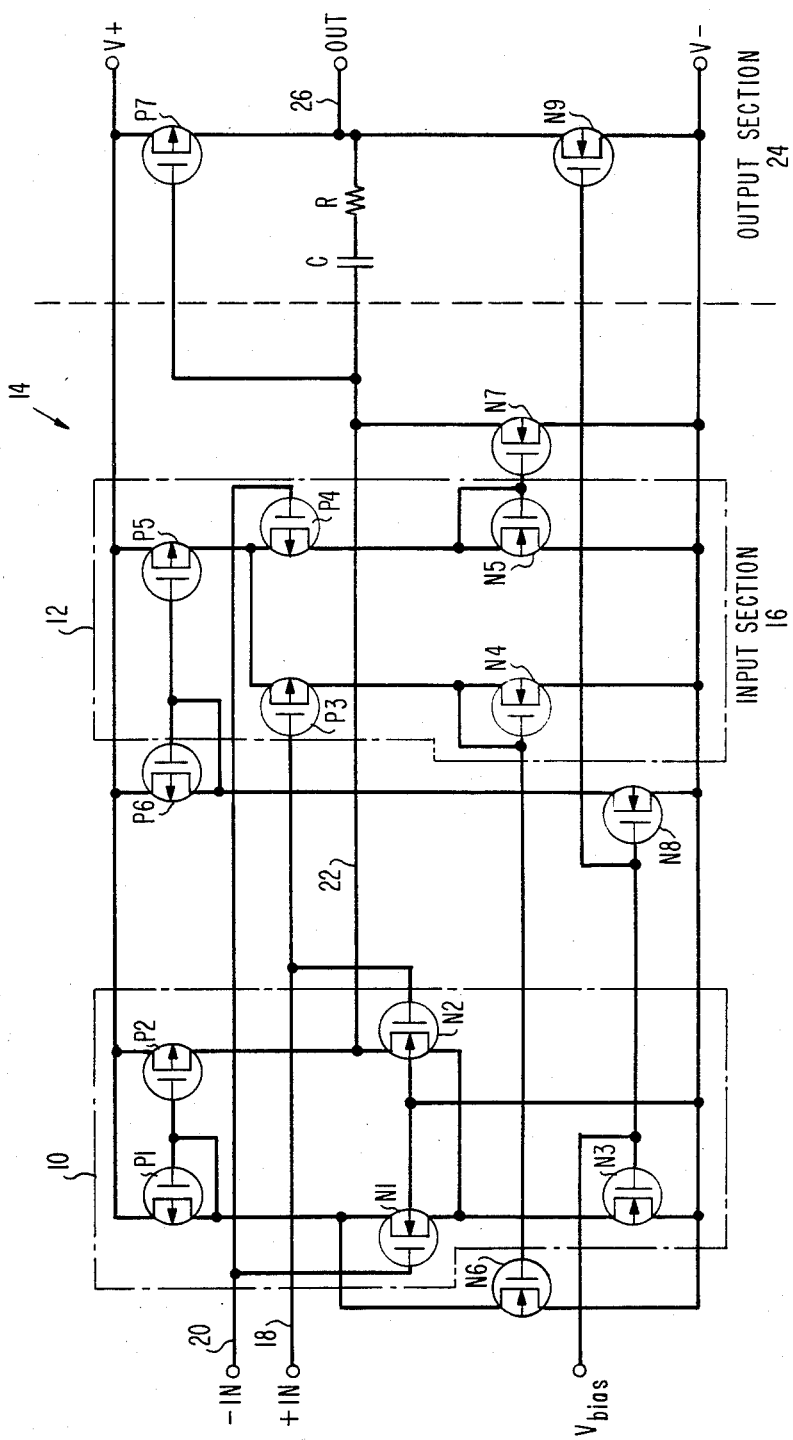
FIG. 3 is a schematic circuit diagram of a CMOS extended common-mode range operational amplifier in which the amplifiers of FIG. 1 and FIG. 2 are interconnected in accordance with the present invention.

The amplifier 14 of FIG. 3 is designed to combine the stages 10 and 12 of FIGS. 1 and 2 in parallel in an input section 16 in such a manner that their common mode voltage ranges are combined in a continuous manner with a relatively high degree of common mode rejection. The reference symbols used in FIGS. 1 and 2 are retained for corresponding elements in the amplifier 14 of FIG. 3. An N-type input stage 10, which includes the devices P1,P2,N1,N2, and N3, is connected between a positive supply voltage node V+ and a negative supply voltage node V− as in FIG. 1. A P-type input stage 12, which includes the devices P3,P4,P5,N4, and N5, is connected between the supply nodes V+ and V− as in FIG. 2, except that the gates of N4 and N5 are not connected together, but instead are both connected to the drains of their respective devices. The gates of N2 and P3 are connected together to form a positive input node 18, while the gates of N1 and P4 are connected together to form a negative input node 20. The following groups of devices contain members which are designed to be identical with each other: P1 and P2; N1 and N2; P3 and P4; N4 and N5; N6 and N7.

A current mirror transistor N6 is connected between the node V− and the common node of P1 and N1. The gate of N6 is tied to the gate of N4, with the result that the current through N6 is proportional to the current through N4. Another current mirror transistor N7 is connected between the supply node V− and the common node of P2 and N2. The gate of N7 is tied to the gate of N5, with the result that the current through N7 is proportional to the current through N5.

The bias current supplied by N3 is regulated by a bias voltage Vbias applied to its gate. This voltage also controls the current through P5 by means of a pair of devices N8 and P6 connected in series between nodes V+ and V− to form a current "turn-around" configuration. The source of P6 is connected to node V+ and its gate is connected to its drain and to the gate of P5. The source of N8 is connected to the node V−, its drain is connected to the drain of P6, and its gate is tied to the gate of N3.

The output node 22 of the N-type input stage is at the common node of N2 and P2 and is also an input node for an output section 24 made up of a current source transistor N9 and an output transistor P7. The current source N9 has its source connected to the supply node V−, its gate connected to Vbias, and its drain connected to the drain of P7. The source of P7 is connected to supply node V+. The gate of P7 is the input node of the output stage 24 and is therefore connected to the output node 22 of the input section 16. A frequency compensation network consisting of a capacitor C and a resistor R in series is connected between the input node 22 of the output section 24 and the common node of P7 and N9. The output is taken from the drain of the output transistor P7.

The structure of the amplifier 14 is such that when the input common mode voltage is near the positive supply voltage V+, the N-channel stage 10 will be in its linear region of operation, whereas the P-channel stage 12 will have begun to cut off. Likewise, when the input common mode voltage is close to the negative supply voltage V−, it is the P-channel stage 12 which will be in its linear region, while the N-channel stage 10 will be in a degraded mode of operation. Finally, when the input common mode voltage is at an intermediate value, both stages 10,12 will be in their linear region of operation and optimal performance will be obtained. The connection of the substrates of the devices N1 and N2 to the negative supply voltage V−, rather than to their respective source/substrates, increases the threshold voltage of N1 and N2 at the positive extreme of the input common mode voltage by virtue of the body effect.

Figure 4:
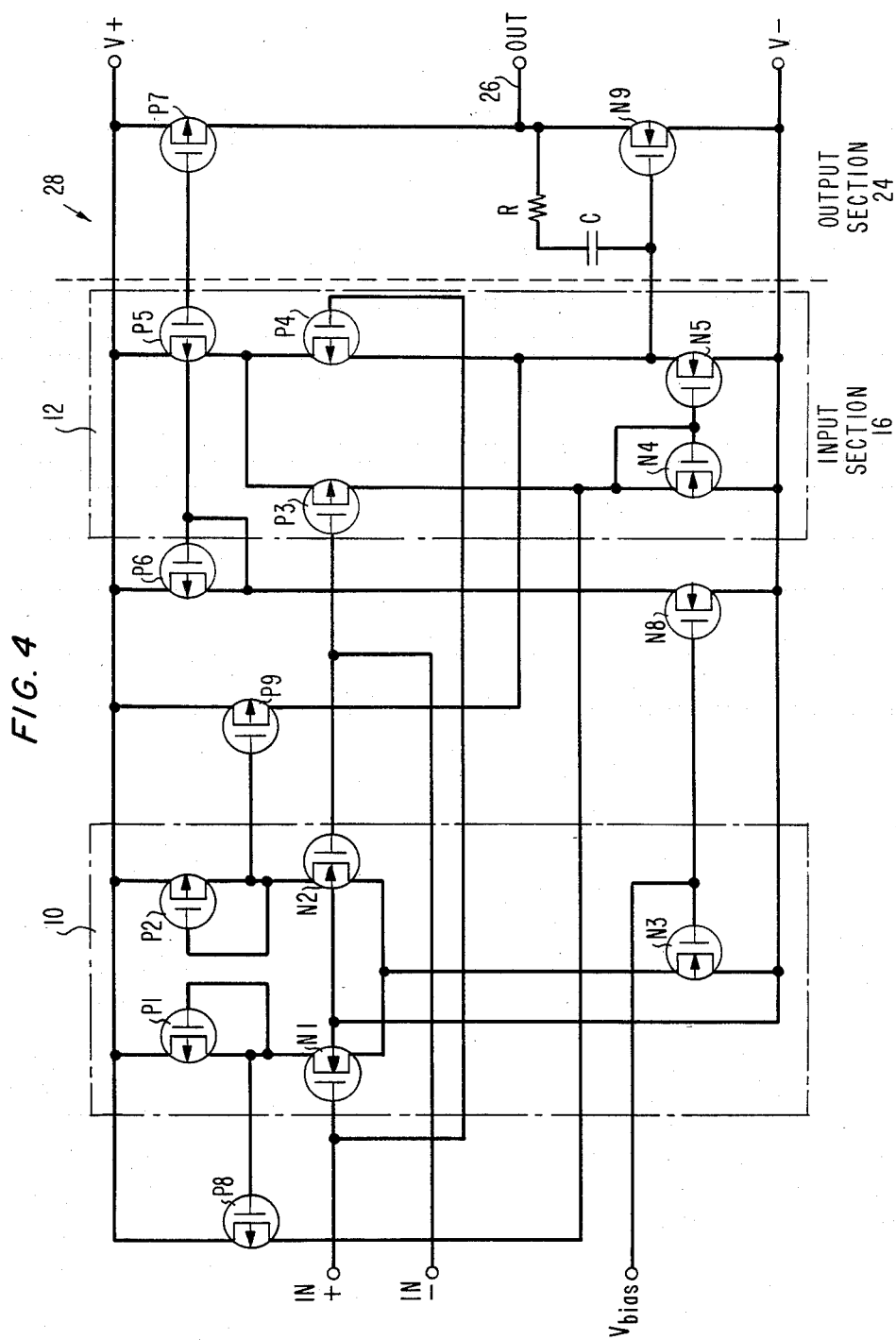
FIG. 4 is a schematic circuit diagram of an alternative form of the amplifier of FIG. 3.

Another example of an amplifier in accordance with the invention is the amplifier 28, shown in FIG. 4. The same reference symbols are used for devices which correspond to those of the amplifier 14 of FIG. 3, despite some differences in the connections of the gates. The amplifier 28 is a modification of the amplifier 14 in that the current mirror transistors N6 and N7 of that circuit are replaced in the amplifier 28 of FIG. 4 by the current mirror transistors P8 and P9. Since these have a P-type conductivity conduction channel, their sources are connected to the supply node V+. The drain of P8 is connected to the common node of P3 and N4, and its gate is tied to the common node of P1 and N1. The drain of P9 is tied to the common node of P4 and N5, and its gate is tied to the common node of P2 and N2. The gates of P1 and P2 are tied to the drains of their own respective devices. The gates of N5 and N6 are connected together and to the drain of N4. The output node of the input section is now at the drain of P4.

It will be apparent to those skilled in the art that bipolar or other types of transistors may also be used in place of MOS transistors to practice the invention.

The output stage 20 is merely one example of an output stage for utilizing the output from the input section 16 of the amplifiers 14, 28. Other configurations of output stages may be substituted as desired.

What is claimed is:

1. An operational amplifier comprising:
   first and a second power supply voltage nodes;
   a first differential input stage connected between said supply voltage nodes and including first and second input current branches with one end connected to said first supply voltage node and the other end connected to one side of a first current source, the other side of said first current source being connected to said second supply voltage node;
   a second differential input stage connected between said supply voltage nodes, in parallel with said first stage, and including first and second input current branches with one end connected to said second supply voltage node and the other end connected to one side of a second current source, the other side of said second current source being connected to said first supply voltage node;
   first means coupled between said first branch of said first stage and said first branch of said second stage for establishing proportional currents in them;
   second means coupled between said second branch of said first stage and said second branch of said second stage for establishing proportional currents in them, and
   an output stage having an input node coupled to said second branch of said first stage.

2. The amplifier defined in claim 1 wherein:
   each of said stages comprises first and second differential input transistors having their conduction paths connected in the input current paths of said first and second branches, respectively;
   said first means comprises a first current mirror transistor having its conduction path connected between one of said supply voltage nodes and one side of the conduction path of said first input transistor of said first stage and having a control electrode connected to one side of the conduction path of said first input transistor of said second stage, and said second means comprises a second current mirror transistor having its conduction path connected between one of said supply voltage nodes and one side of the conduction path of said second input transistor of said first stage and having a control electrode connected to one side of the conduction path of said second input transistor of said second stage.

3. The amplifier defined in claim 2 wherein said input transistors and said current mirror transistors are field-effect devices for which the control electrode is a gate electrode.

4. The amplifier defined in claim 3 wherein said input transistors of said first stage have conduction channels of a first conductivity type and said input transistors of said second stage have conduction channels of a second conductivity type.

5. The amplfier defined in claim 4 wherein said first and second current mirror transistor have conduction channels of the first conductivity type.

6. The amplifier defined in claim 5 wherein:
said first current source is connected between said one supply node and the other side of the conduction path of said input transistors of said first stage, and
said second current source is connected between said other supply node and other side of the conduction path of said input transistors of said second stage.

7. The amplifier defined in claim 6 wherein:
each branch of said first and second stages includes a field-effect active load transistor connected between the one side of the conduction path of said input transistor of that branch and said supply node which is on that side of said current source for that input stage, the load transistors of said first stage having their gates connected together and to the common node of said first input transistor and said load transistor of said first branch, said load transistors of said second stage having their gates connected to their respective common nodes with their respective input transistors.

8. The amplifier defined in claim 7 wherein said load transistors have conduction channels with a conductivity type opposite to that of said input transistor of their respective branches.

9. The amplifier defined in claim 8 wherein:
said first current source comprises a fieldeffect transistor with a conduction channel of said first conductivity type,
said second current source comprises a fieldeffect transistor with a conduction channel of said second conductivity type, and
the gates of said current source transistors are coupled by proportional current biasing means.

10. The amplifier defined in claim 9 wherein said proportional current biasing means comprises first and second field-effect current mirror transistors with opposite conductivity type conduction paths connected in series between said supply nodes, the one of said current mirror transistors which has its source connected to the one supply node having its gate connected to the gate of said first current source transistor, and the other said current mirror transistor having its gate connected to the gate of said second current source transistor and to the common node of said current mirror transistors.

11. The amplifier defined in claim 10 wherein: said first input transistor of said first stage and said second input transistor of said second stage have their gates connected together, and
said second input transistor of said first stage and said first input transistor of said second stage have their gates connected together.

12. The amplifier defined in claim 11 wherein said output stage comprises:
a field-effect output transistor and a fieldeffect output current source transistor with a conduction channel type opposite that of said output transistor connected in series between said supply nodes, the gate of said output transistor being connected to the common node of said input transistor and said load transistor of said second branch of said first stage, and
frequency compensation means connected between the common node of said output transistor and said output current source transistor and said common node of said input transistor and said load transistor of said second branch of said first stage.

* * * * *